United States Patent [19]

Wong et al.

[11] Patent Number: 5,406,122

[45] Date of Patent: Apr. 11, 1995

[54] MICROELECTRONIC CIRCUIT STRUCTURE INCLUDING CONDUCTOR BRIDGES ENCAPSULATED IN INORGANIC DIELECTRIC PASSIVATION LAYER

[75] Inventors: Wah-Sang Wong, Montebello; William D. Gray, Redondo Beach; Cheng P. Wen, Mission Viejo, all of Calif.

[73] Assignee: Hughes Aircraft Company, Los Angeles, Calif.

[21] Appl. No.: 143,797

[22] Filed: Oct. 27, 1993

[51] Int. Cl.⁶ ...................... H01L 23/48; H01L 29/46
[52] U.S. Cl. ..................................... 257/753; 257/763; 257/781; 257/770; 257/276
[58] Field of Search ............... 257/276, 763, 781, 753, 257/745, 759

[56] References Cited

U.S. PATENT DOCUMENTS

| | | | |
|---|---|---|---|
| 3,668,484 | 6/1972 | Greig et al. | 257/763 |
| 4,319,258 | 3/1982 | Harnagel et al. | 257/435 |
| 4,417,387 | 11/1983 | Heslop | 257/763 |

OTHER PUBLICATIONS

"Flip Chip Manufacturing Technology for GaAs MMIC", by W. S. Wong et al., 1993 U.S. Conf. on GaAs Manufacturing Technology, May 1993, Atlanta, Ga.

*Primary Examiner*—Jerome Jackson
*Assistant Examiner*—Nathan K. Kelley
*Attorney, Agent, or Firm*—Georgann S. Grunebach; Terje Gudmestad; W. K. Denson-Low

[57] ABSTRACT

A gallium arsenide Monolithic-Microwave-Integrated-Circuit (MMIC) flip chip or other microelectronic circuit structure (10) includes a plated gold bridge (28) which serves as metal interconnect crossover between sites (24,-26) on a substrate (12). A first inorganic dielectric passivation layer (16), preferably of silicon dioxide, is formed under and supports the bridge (28). A second inorganic dielectric passivation layer (30), also preferably of silicon dioxide, is formed over and encapsulates the bridge (28) and the chip surface. A titanium/gold/titanium membrane (22) is formed under the bridge (28) to enable adhesion of the bridge (28) to the first passivation layer (16) and form plating contacts for the bridge (28). A contact bump post (38) is formed in a bump hole or via (32) which extends through the first and second passivation layers (16,30) to a bump contact site (34) on the substrate (12). Another titanium/gold/titanium membrane (40) is formed on the bump post (38) and the wall of the bump via (32) to provide a plating contact for a bump (42) which is plated on the membrane (40) inside the bump via (32) where the bump post (38) is located.

14 Claims, 4 Drawing Sheets

MICROELECTRONIC CIRCUIT STRUCTURE INCLUDING CONDUCTOR BRIDGES ENCAPSULATED IN INORGANIC DIELECTRIC PASSIVATION LAYER

BACKGROUND OF THE INVENTION

1. Field of the Invention

The present invention generally relates to the art of microelectronic circuits, and more specifically to a gallium arsenide Monolithic-Microwave-Integrated-Circuit (MMIC) flip chip or other microelectronic circuit structure including inorganic dielectric passivation layers for supporting interconnecting conductor bridges and encapsulating the surface of the structure.

2. Description of the Related Art

The flip chip configuration is highly desirable for the fabrication of MMIC microelectronic circuit structures since it eliminates the need for wirebonds or other leads to interconnect a MMIC chip on a ceramic (for example Low-Temperature-Cofired-Ceramic (LTCC)) substrate. A MMIC flip chip includes metallic (e.g., silver or gold) plated electrical contact bumps which extend from input-output (I/O) and electrical bias sites on the chip surface for mating with the contacts on the ceramic substrate.

The chip is inverted and placed in contact with the ceramic substrate such that the bumps are aligned and pressed against solder dots formed on the contacts. Heat is applied to cause the solder to reflow and fuse the bumps to the contacts to provide a permanent ohmic contact.

A description of MMIC flip chip technology is presented in a paper entitled "Flip Chip Manufacturing Technology for GaAs MMIC", by W. S. Wong et al, 1993 U.S. Conference on GaAs MANufacturing TECHnology, May 1993, Atlanta Ga.

GaAs MMICs are currently passivated by a thin (2,000 angstrom) silicon nitride film, which provides limited protection for the active layer regions of GaAs FETs, and forms MIM capacitors for MMIC circuits. However, interconnects such as transmission lines and airbridges are exposed to ambient air, especially so for high-power MMICs.

Moisture can easily become trapped in corners of metal lines and beneath airbridges. In the case of flip chips, these exposed metal features are vulnerable to damage during the solder reflow mounting process and other assembly and handling steps. Chemicals such as solder flux, organic solvents and photoresist residue can cause short circuits and long term microwave module reliability problems.

Gold leaching and shorting of interconnect metallizations and airbridges can occur during the solder reflow process if solder contacts the chip surface. Gold can also be leached from contact bump posts due to wicking of solder from the bumps to bump posts. In addition, circuit elements on MMIC chips can be damaged during the solder defluxing process by the solvents used to remove the flux.

Solder dots can be applied to contact sites on a metallized ceramic substrate by silk screening. However, the lateral dimensional tolerance of this process is insufficient for MMICs with exposed metallizations due to ragged edges which can be formed on solder dots when the silk screen is removed, and which can cause short circuits to the metallizations on MMIC chips.

For this reason, dabbing is conventionally used for applying solder to ceramic substrates on which MMICs are to be mounted. In this expensive and time consuming method, each solder dot is formed individually by dabbing a precise amount of solder onto the substrate from an applicator. Although precise lateral dimensional tolerance can be achieved using this method, the thickness or height of the solder areas cannot be controlled accurately. The height of the bumps on the MMIC flip chips must be sufficiently precise to make up for this deficiency, adding to the complexity and expense of the fabrication process.

More importantly, existing GaAs flip chip MMICs do not provide sufficient hermetic environmental protection for moisture and mobile ions, which are major contributors to corrosive, electro-chemical and other circuit failures.

SUMMARY OF THE INVENTION

A gallium arsenide Monolithic-Microwave-Integrated-Circuit (MMIC) flip chip or other microelectronic circuit structure embodying the present invention includes a plated gold bridge which serves as crossover for metal interconnects on the chip. A first inorganic dielectric passivation layer is formed under and supports the bridge. A second inorganic dielectric passivation layer is formed over and encapsulates the bridge and the chip surface.

The passivation layers protect the bridge and the surface of the MMIC flip chip from damage and contamination during assembly and handling. Silicon dioxide is the preferred material for the passivation layers because it does not absorb moisture, and exhibits a desirable compressive stress on a GaAs MMIC flip chip, has high temperature cycling stability and is compatible with existing GaAs MMIC processing technology.

The passivation layers further prevent gold leaching during chip mounting operation. Since the surface of the MMIC chip and the metallizations are encapsulated by protective passivation, an efficient and inexpensive silk screen process can be used for applying solder to ceramic substrates on which MMIC chips are to be mounted by the reflow soldering process. Since the solder height can be precisely controlled using the silk screen process, the tolerance for contact bump heights can be reduced, thereby further reducing the fabrication cost and complexity.

A titanium/gold/titanium metallization system is used for the transmission lines on the chip. The titanium layer acts as an interlayer for good adhesion of the metallized lines to silicon dioxide. It also is used for end point detection in a reactive ion etching process which is used to form the holes for the bump and the posts of the bridge.

Another titanium/gold/titanium membrane is formed on the first passivation layer and under the plated bridge to enable adhesion of the bridge to the first passivation layer and form plating contacts for the bridge. A contact plated bump post is formed in a bump hole or via which extends through the first and second passivation layers to a bump contact site on the chip substrate.

Yet another titanium/gold/titanium membrane is formed on the second passivation layer and on the bump post and the walls of the bump via to provide a plating contact for a bump which is plated on the membrane inside the bump via where the bump post is located.

These and other features and advantages of the present invention will be apparent to those skilled in the art

DETAILED DESCRIPTION OF THE INVENTION

Figure 1:
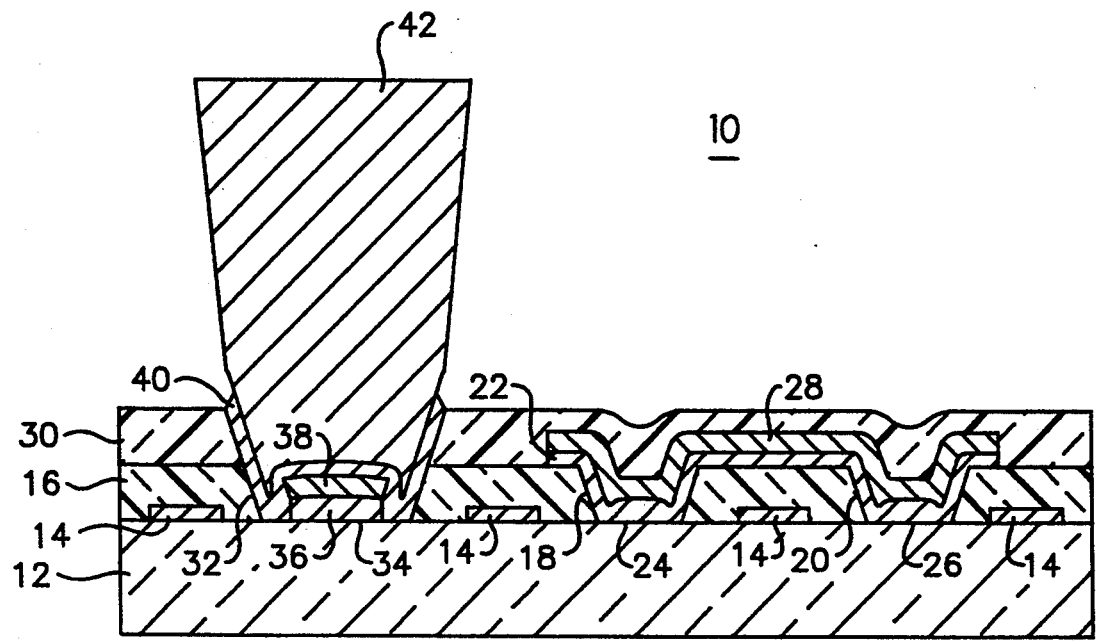
FIG. 1 is a simplified cross-sectional view illustrating a microelectronic circuit structure embodying the present invention.

A microelectronic structure 10 embodying the present invention is illustrated in FIG. 1. The structure 10 is preferably a Monolithic-Microwave-Integrated-Circuit (MMIC) flip chip, although the invention is not so limited.

The structure 10 includes a substrate 12 formed of gallium arsenide (GaAs) or other group III-V semiconductor material. The passivation process in accordance with the invention starts after all active device elements are fabricated in a general manner well known to those skilled in the art. Next, all transmission lines are metallized. An interconnect transmission line metallization pattern 14, preferably of titanium/gold/titanium, is formed on the surface of the substrate 12. The pattern 14 interconnects the various circuit elements of the structure 10 in a known manner, although not illustrated in detail.

A first passivation layer 16 is formed on the substrate 12 and metallization pattern 14. The layer 16 is formed of an inorganic dielectric material, preferably silicon dioxide ($SiO_2$). Other possible materials for the layer 16 include silicon nitride ($Si_3N_4$), silicon carbide (SIC) and diamond. The layer 16 is approximately 1-2 micrometers thick, with the preferred thickness being two micrometers.

Holes or vias 18, 20 and 32 are formed through the layer 16. A titanium/gold/titanium membrane 22 is continuously formed on the walls of the vias 18, 20 and 32 on ohmic contact sites 24 and 26 and a bump post site 34, on the substrate 12 at the bottoms of the vias 18, 20 and 32, and on the surface of the passivation layer 16 between the vias 18 and 20. The contact sites 24 and 26 in general provide metal interconnect crossover for circuit elements on the substrate 12 which are part of the metallization pattern 14.

Although not explicitly illustrated, the membrane 22 includes a layer of gold which is approximately 1,000 angstroms thick, and is sandwiched between two titanium layers which are each approximately 200 angstroms thick. The advantages of gold as an electrical interconnect material are well known. The titanium layers provide excellent adhesion of the gold layer to the GaAs substrate 12 and to silicon dioxide.

A gold bridge 28 which is approximately 3-4 micrometers thick is plated on the membrane 22. The bridge 28 replaces a conventional airbridge in a prior art MMIC chip. The lower titanium layer of the membrane 22 enhances adhesion of the membrane 22 to the passivation layer 16, whereas the membrane 22 itself provides a plating contact for the bridge 28. A bump post 38 is also plated on the membrane 22 simultaneously.

The bridge 28 and the portion of membrane 22 underneath it provide electrical interconnection between the contact sites 24 and 26, with the end portions of the bridge 28 and membrane 22 extending through the vias 18 and 20 to the contact sites 24 and 26 respectively. The central portion of the bridge 28 and membrane 22 are supported by the portion of the passivation layer 16 between the vias 18 and 20.

A second passivation layer 30 is formed on the bridge 28 and the exposed portions of the first passivation layer 16. The layer 30 is also preferably formed of silicon dioxide, although the invention is not so limited. The layers 16 and 30 can alternatively be formed of different inorganic dielectric materials. For example, the layer 16 can be silicon dioxide and the layer 30 can be silicon nitride, or vice-versa. The layer 30 is approximately 500 angstroms—2 micrometers thick, with the preferred thickness being one micrometer.

The layers 16 and 30 completely passivate the structure 10, and protect the bridge 28 and the surface of the substrate 12 from physical damage and contamination during the solder reflow process and other assembly and handling steps. Since the metallization pattern 14 and bridge 28 are environmentally encapsulated, they are not vulnerable to shorting by ragged edges of solder dots on a ceramic substrate (not shown).

This enables the solder dots to be formed on the ceramic substrate using an efficient and inexpensive silk screening process as opposed to the conventional dabbing process. The layers 16 and 30 also exert compressive stress on the substrate 12 which resists delamination of the structure 10.

A bump hole or via 32 is formed through the passivation layers 16 and 30 and opens onto a contact bump site 34 on the substrate 12. The bump site 34 provides I/O contact or electrical bias between a circuit element (not shown) on the substrate 12 and a metallization pattern on the ceramic substrate. A titanium/gold/titanium membrane 36, which is fabricated in the same process step as the membrane 22, is formed on the central portion of the bump site 34. A gold bump post 38 is formed on the membrane 36.

Another titanium/gold/titanium membrane 40 is formed on the walls of the bump hole or via 32, the bump post 38, and portions of the bump site 34 which are laterally external of the membrane 36. The composition of the membrane 40 is preferably the same as that of the membrane 22.

A silver plated bump 42 is formed on the membrane 40 in the bump via 32, and extends above the surface of the layer 30 by a suitable height, typically 75–95 micrometers. Although only one bridge 28 and bump 42 are shown in FIG. 1 for simplicity of illustration, an actual microelectronic circuit structure embodying the invention will include a large number of bridges and bumps.

Although not specifically illustrated, the structure 10 is mounted on a ceramic substrate, for example a Low-Temperature-Cofired-Ceramic (LTCC) substrate, on which solder dots are formed on mating contact sites. The structure 10 is inverted, and pressed against the ceramic substrate such that the bump 42 contacts one of the solder dots. Heat is applied to cause the solder to reflow and adhere the bump 42 to the contact. The membrane 40 prevents solder from wicking up the bump 42 and leaching gold from the bump post 38 during the solder reflow process.

Figure 2:
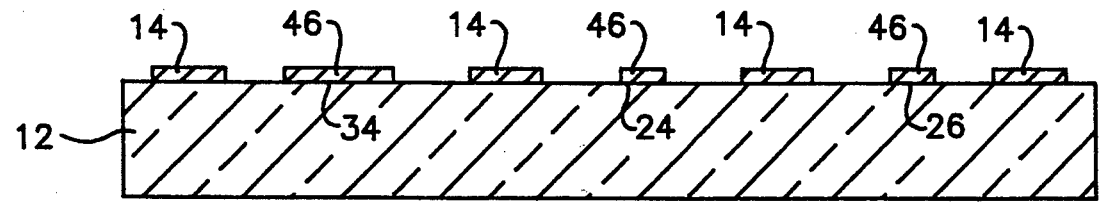
FIGS. 2 to 14 are simplified cross-sectional views illustrating a method of fabricating the structure of FIG. 1 in accordance with the invention.
Figure 3:
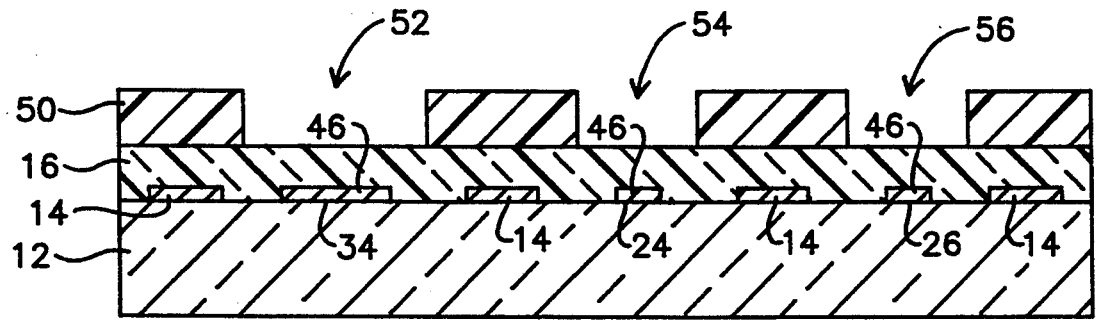

A method of fabricating the structure 10 in accordance with the present invention is illustrated in FIGS. 2 to 14. In FIG. 2, the titanium-gold-titanium metallization pattern 14 is formed on the substrate 12, and simultaneously a titanium-gold-titanium metallization pattern 46, is formed on the central portions of the contact sites 24, 26 and 34. In FIG. 3, the passivation layer 16 is formed on the substrate 12, metallization patterns 14 and 46 by, for example, plasma enhanced chemical vapor deposition (PECVD).

A photoresist layer 50 is formed on the layer 16, and is patterned to form holes or vias 52, 54 and 56 in alignment with the contact sites 34, 24 and 26 respectively. The layer 16 is then etched through by reactive ion etching (RIE) in a carbon tetrafluoride/oxygen ($CF_4/O_2$) plasma with the photoresist layer 50 acting as an etch resist layer.

Figure 4:
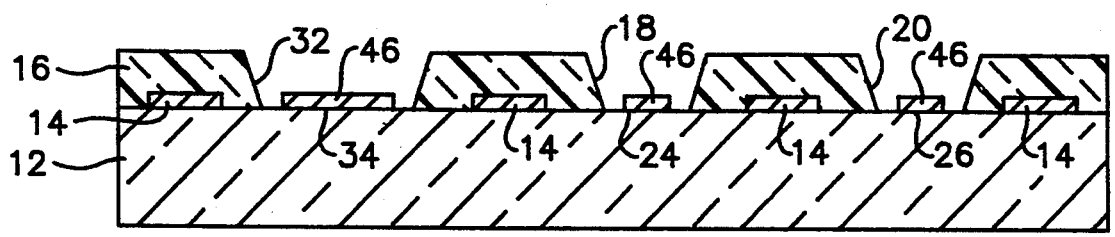

Portions of the layer 50 at the edges of the vias 52, 54 and 45 reflow during this step such that the vias 32, 18 and 20 which are formed as illustrated in FIG. 4 have inclined sidewalls which enhance the continuity of the membranes 40 and 22 which will be subsequently formed in the vias 32, 18 and 20 respectively. Removal of the photoresist layer 50 produces the intermediate structure illustrated in FIG. 4.

The metallization 46 enables precise endpoint detection for etching through the layer 16. As long as there is silicon dioxide (layer 16) or titanium (upper layer of metallization 46) remaining above the gold layer of the metallization 46, the substrate 12 as viewed through the vias 52, 54 and 56 will have a metallic grey color. As soon as the titanium layer of the metallization 46 is substantially etched through, the color will change from metallic grey to gold.

This color change can be sensed with high accuracy using a conventional photoelectronic sensor (not shown). The etching is terminated upon detection of the color change. In this manner, the endpoint for the etching process is precisely determined such that the passivation layer 16 can be precisely etched through without over-etching and removing material from the substrate 12 in the contact sites 34, 24 and 26.

Figure 5:
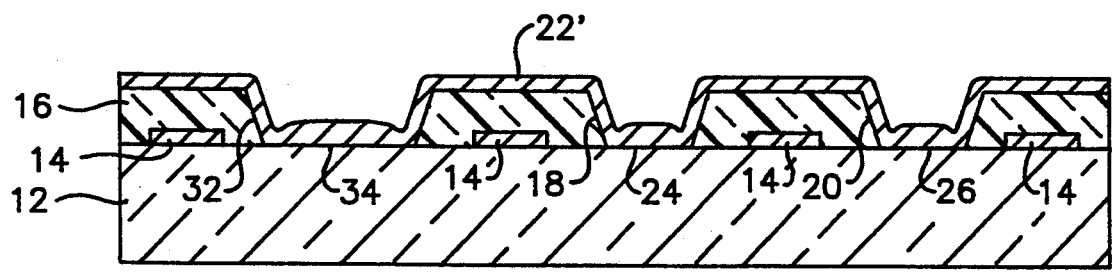

In the step of FIG. 5, a titanium/gold/titanium layer 22' which will be subsequently patterned to form the membranes 22 and 36 is sputtered onto the passivation layer 16 and contact sites 34, 24 and 26. The metallization 46 is merged into the layer 22' during this step. The lower titanium layer of the layer 22' provides a slightly oxidized surface for good adhesion to the passivation layer 16.

Figure 6:
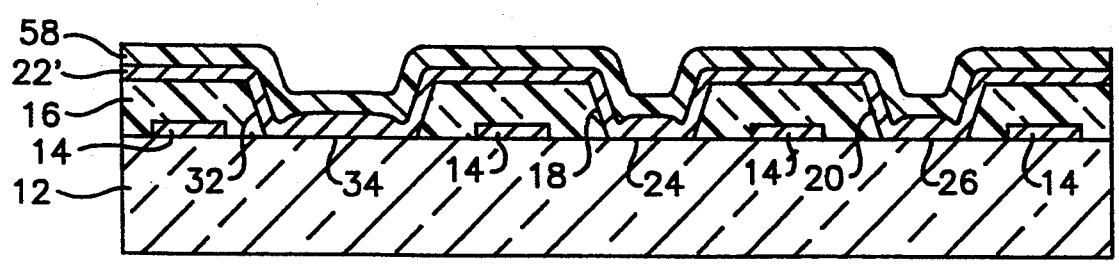
Figure 7:
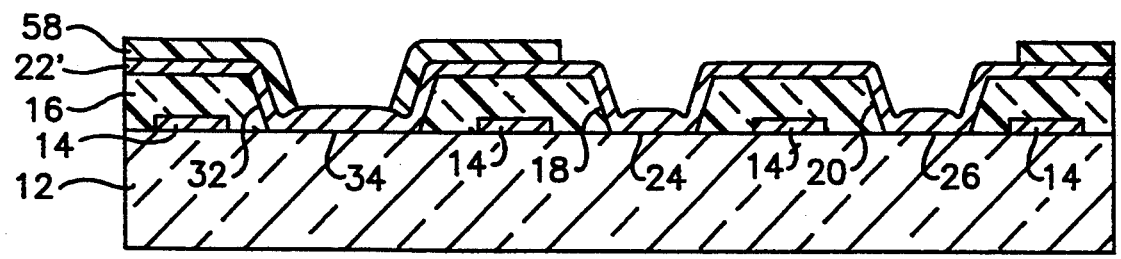
Figure 8:
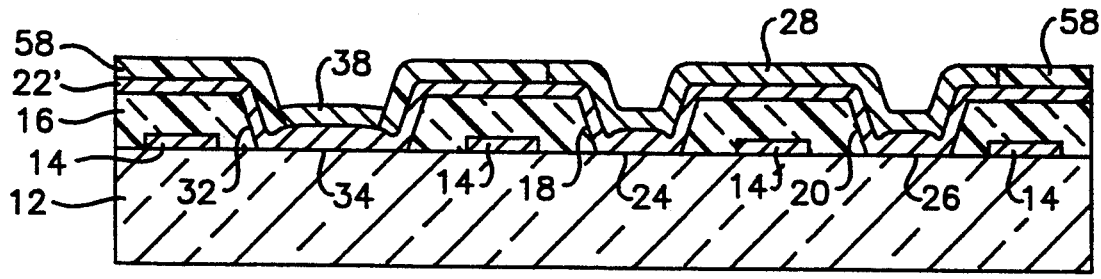

In the step of FIG. 6, a photoresist layer 58 is formed on the layer 22' and, as illustrated in FIG. 7, patterned to expose the portion of the layer 22' in the bottom of the bump via 32 and in the areas in which the bridge 28 is to be formed. In FIG. 8, a low frequency pulse-plating process using a gold cyanide plating solution is applied to plate gold on the layer 22' in these areas and thereby form the bump post 38 and the bridge 28. The layer 22' acts as a contact for the plating process.

Figure 9:
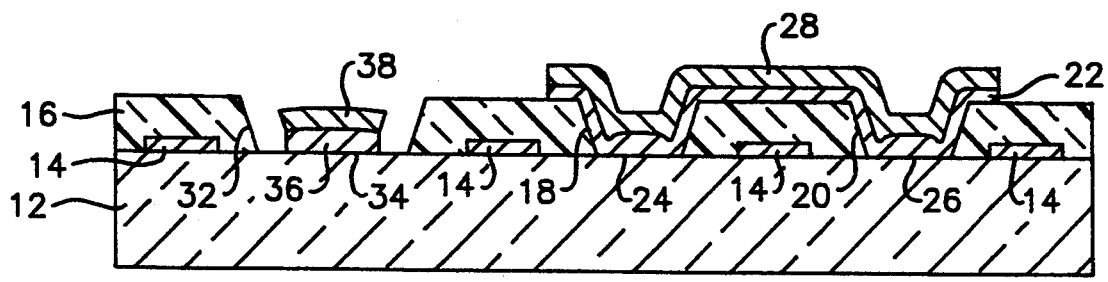

As illustrated in FIG. 9, the photoresist layer 58 is removed, and the portions of the layer 22' which are not covered by the bump post 38 and the bridge 28 are removed. The titanium layers of the layer 22' are removed using RIE, and the gold layer thereof is removed using a cyanide based gold etching solution.

Figure 10:
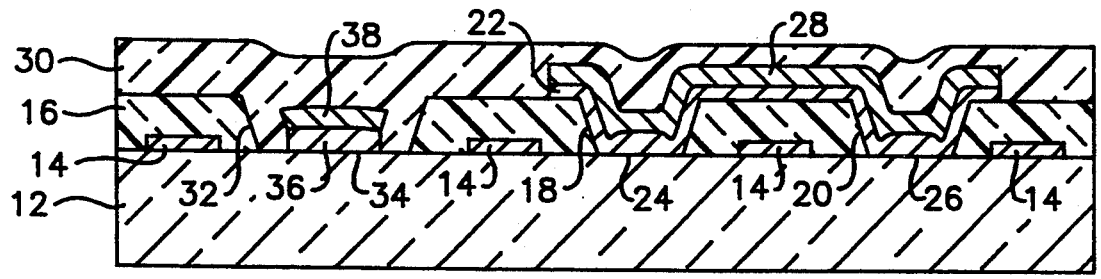

In FIG. 10, the second passivation layer 30 is formed on the bridge 28, the bump post 38 and exposed portions of the passivation layer 16 and contact site 34 using PECVD. The bridge 28 is thereby supported by the first passivation layer 16 and environmentally sealed or encapsulated by the second passivation layer 30.

Figure 11:
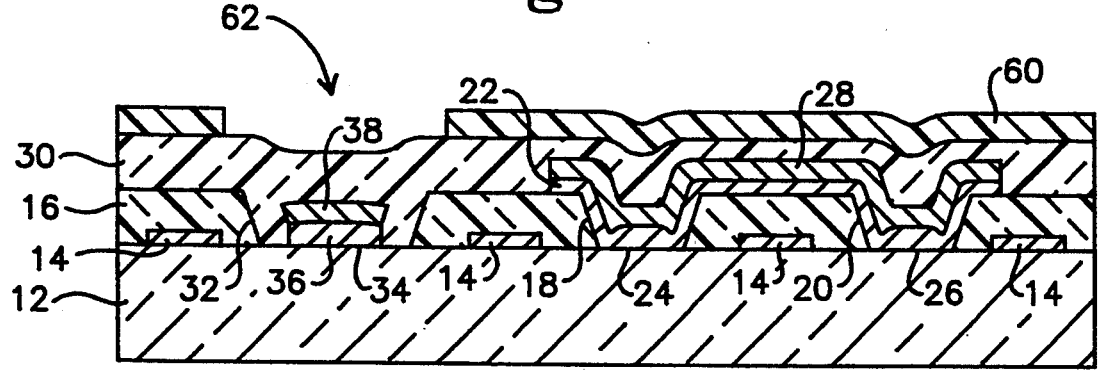
Figure 12:
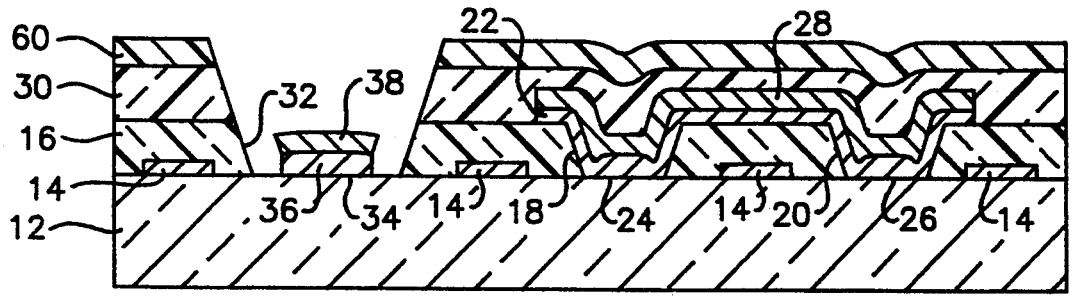

In FIG. 11, a photoresist layer 60 is applied and patterned to form a hole or via 62 which is aligned with the bump site 34. As illustrated in FIG. 12, the first and second passivation layers 16 and 30 are etched through using RIE as described above with reference to FIGS. 3 and 4 to expose the bump post 38 and portions of the bump site 34 which are laterally external of the bump post 38.

Figure 13:
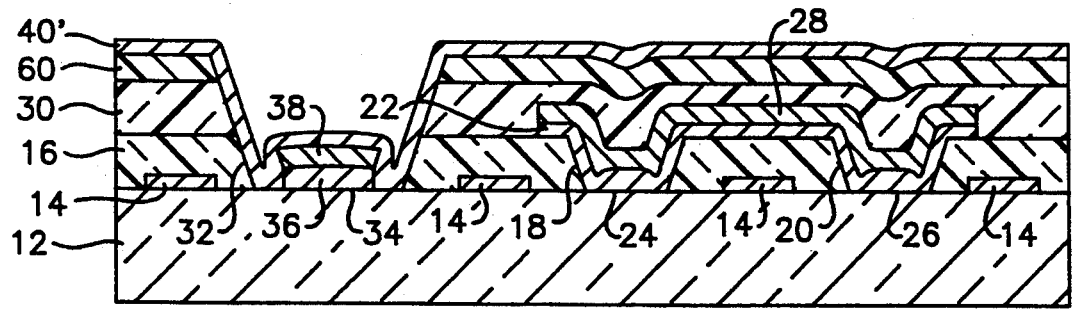
Figure 14:
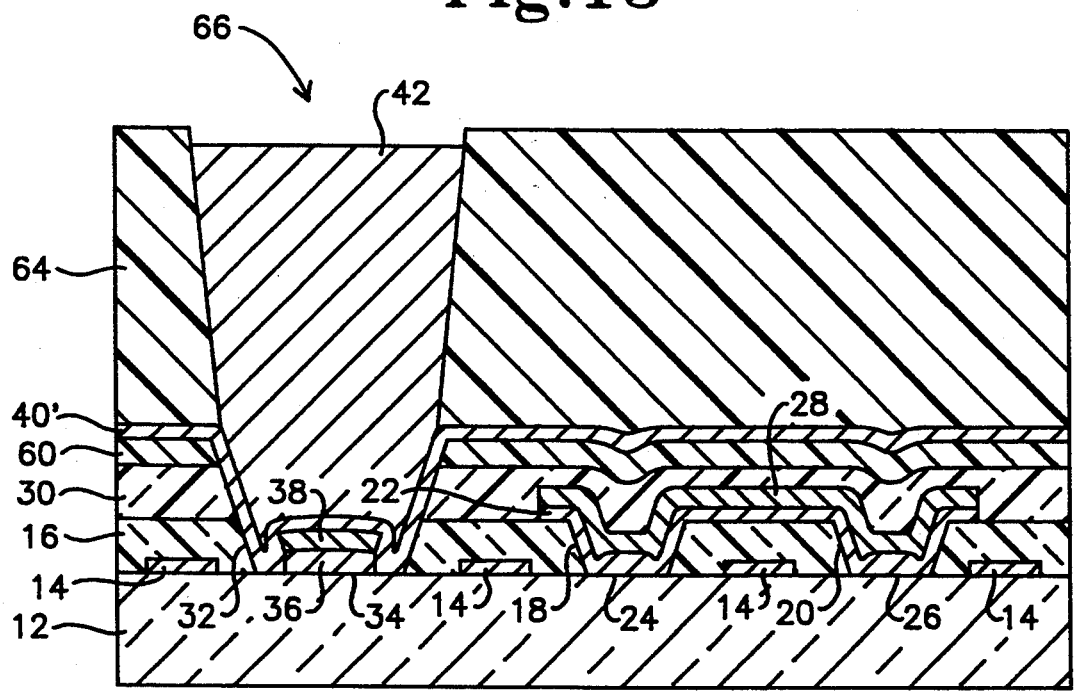

In the step of FIG. 13, a titanium/gold/titanium layer 40' which will be subsequently patterned to form the membrane 40 is sputtered onto the photoresist layer 60, bump post 38 and exposed portions of the bump site 34. In FIG. 14, a photoresist layer 64 having a thickness of approximately 75–95 micrometers is laminated onto the layer 40' and patterned to form a bump hole 66 which is aligned with the bump site 34. The silver plated bump 42 is then plated onto the layer 40' in the bump via 66 using conventional bump processing as described in author's technical paper cited on page 2.

After formation of the bump 42, the photoresist layer 64, portions of the layer 40' which are laterally external of the bump via 66 and the photoresist layer 60 are removed to produce the structure 10 as illustrated in FIG. 1. The bump post 38 and membrane 40 is environmentally sealed by the second passivation layer 30 so that solder cannot wick along the surface of the bump 42 to the bump post 38 during reflow soldering to leach gold from the bump post 38.

While an illustrative embodiment of the invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

We claim:

1. A Monolithic-Microwave-Integrated-Circuit (MMIC) structure, comprising:
    a semi-insulating substrate having first and second electrical contact sites;
    a first inorganic dielectric passivation layer formed on the semi-insulating substrate;
    first and second holes which are formed through the first passivation layer and open onto said first and second contact sites respectively;
    a multi-layer metallization membrane formed upon the semi-insulating substrate and upon the first inorganic dielectric passivation layer;
    an electrically conductive bridge formed on the multi-layer metallization membrane supported by the first passivation layer, the bridge extending through said first and second holes to said first and second contact sites respectively;
    a second inorganic dielectric passivation layer which is formed on and seals the first passivation layer and the bridge;
    a bump hole having a wall which is formed through the first and second passivation layers and opens onto an electrical bump site on the substrate;
    an electrically conductive bump post which is formed on said bump site;
    a titanium/gold/titanium membrane which is formed on and seals the bump post, a portion of said bump site which surrounds the bump post and said wall of said bump hole; and an electrically conductive bump which is formed on the membrane in said bump hole.

2. A Monolithic-Microwave-Integrated Circuit (MMIC) structure as in claim 1, in which the first and second passivation layers are formed of silicon dioxide.

3. A Monolithic-Microwave-Integrated Circuit (MMIC) structure as in claim 2, in which the first passivation layer has a thickness of approximately 1–2 micrometers.

4. A Monolithic-Microwave-Integrated Circuit (MMIC) structure as in claim 2, in which the second passivation layer has a thickness of approximately 500 angstroms—2 micrometers.

5. A Monolithic-Microwave-Integrated Circuit (MMIC) structure as in claim 2, wherein the multi-layer metallization membrane comprises a titanium/gold/titanium membrane formed beneath the bridge, over said first and second contact sites within the first passivation layer.

6. A Monolithic-Microwave-Integrated Circuit (MMIC) structure as in claim 5, in which said titanium/gold/titanium membrane comprises:
first and second titanium layers which are approximately 200 angstroms thick; and
a gold layer which is sandwiched between the first and second titanium layers and is approximately 1,000 angstroms thick.

7. A Monolithic-Microwave-Integrated Circuit (MMIC) structure as in claim 2, further comprising a titanium-gold-titanium metallization circuit formed on the substrate under the first passivation layer.

8. A Monolithic-Microwave-Integrated Circuit (MMIC) structure as in claim 1, in which the first and second passivation layers are formed of materials selected from the group consisting of silicon dioxide, silicon nitride, silicon carbide and diamond.

9. A Monolithic-Microwave-Integrated-Circuit (MMIC) structure as in claim 1, wherein said semi-insulating substrate further comprises semiconductor materials from the group III-V.

10. A Monolithic-Microwave-Integrated Circuit (MMIC) structure as in claim 1, wherein said semi-insulating substrate further comprises semiconductor material having a resistivity of greater than $10^5$ ohms-cm.

11. A Monolithic-Microwave-Integrated Circuit (MMIC) structure as in claim 6, wherein said electrically conductive bridge further comprises gold formed upon said gold layer of said titanium/gold/titanium membrane.

12. A Monolithic-Microwave-Integrated-Circuit (MMIC) structure, comprising:
a semi-insulating substrate formed from semiconductor material having first and second electrical contact sites;
a first inorganic dielectric passivation layer formed on the semi-insulating substrate;
first and second holes which are formed through the first passivation layer and open onto said first and second contact sites respectively;
a first multi-layer membrane comprised of titanium/gold/titanium layers formed upon the semi-insulating substrate;
a gold bridge formed upon the gold layer of said first titanium/gold/titanium membrane, said bridge supported by the first passivation layer the bridge having portions which extend through said first and second holes to said first and second contact sites respectively;
a second inorganic dielectric passivation layer which is formed on and seals the first passivation layer and the bridge;
a bump hole having a wall which is formed through the first and second passivation layers and opens onto an electrical bump site on the substrate;
an electrical conductive bump post which is formed on said bump site;
a second multi-layer membrane comprised of titanium/gold/titanium layers which is formed on and seals the bump post, a portion of said bump site which surrounds the bump post and said wall of said bump hole; and
an electrically conductive bump which is formed on the gold layer of the second multi-layer membrane in said bump hole.

13. A Monolithic-Microwave-Integrated-Circuit (MMIC) structure as in claim 12, wherein said semi-insulating substrate further comprises semiconductor material from the Group III-V.

14. A Monolithic-Microwave-Integrated-Circuit (MMIC) structure as in claim 12, wherein said semi-insulating substrate further comprises semiconductor material having a resistivity of greater than $10^5$ ohm-cm.

* * * * *